United States Patent
Huang et al.

(10) Patent No.: US 6,372,619 B1
(45) Date of Patent: Apr. 16, 2002

(54) METHOD FOR FABRICATING WAFER LEVEL CHIP SCALE PACKAGE WITH DISCRETE PACKAGE ENCAPSULATION

(75) Inventors: Chender Huang, Hsin-Chu; Pei-Hwa Tsao, Taichung, both of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/918,085

(22) Filed: Jul. 30, 2001

(51) Int. Cl.[7] ............................................. H01L 21/28

(52) U.S. Cl. ................. 438/597; 438/106; 438/112; 438/124; 438/612

(58) Field of Search ................... 438/106, 112, 438/110, 118, 124, 126, 127, 612, 613, 614, 615, 617

(56) References Cited

U.S. PATENT DOCUMENTS 6,214,648 B1 * 4/2001 Shin ........................... 438/125

* cited by examiner

Primary Examiner—Keith Christianson
Assistant Examiner—Yennhu B. Huynh
(74) Attorney, Agent, or Firm—Tung & Associates

(57) ABSTRACT

A method for fabricating a wafer level chip scale package with discrete package encapsulation and devices formed by the method are described. A dry film photoresist layer is first deposited on top of a pre-processed wafer complete with a plurality of bond pads and an I/O redistribution metal layer. The dry film photoresist layer is then patterned to form a plurality of trench openings and a plurality of via openings followed by the process of depositing a liquid photoresist material into the plurality of trench openings and plating a conductive metal into the plurality of via openings to form via plugs. After the dry film photoresist layer is removed, an encapsulant layer is printed on top of the wafer to embed the protrusions formed by the liquid photoresist material and the via plugs.

15 Claims, 4 Drawing Sheets

METHOD FOR FABRICATING WAFER LEVEL CHIP SCALE PACKAGE WITH DISCRETE PACKAGE ENCAPSULATION

FIELD OF THE INVENTION

The present invention generally relates to a method for fabricating semiconductor devices from a wafer level chip scale package and more particularly, relates to a method for fabricating semiconductor devices from a wafer level chip scale package that has discrete package encapsulation for minimizing coefficient of thermal expansion mismatch problems.

BACKGROUND OF THE INVENTION

In the fabrication of modern semiconductor devices, the ever increasing device density and decreasing device dimensions demand more stringent requirements in the packaging or interconnecting techniques of such high density devices. Conventionally, a flip-chip attachment method has been used in packaging of semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become impractical for several reasons. One of the problems in utilizing solder paste screening technique in bonding modern semiconductor devices is the paste composition itself. A solder paste is formed by a flux material and solder alloy particles. The consistency and uniformity of the solder paste composition become more difficult to control as the solder bump volume decreases. Even though a solution of the problem has been proposed by using solder paste that contain extremely small and uniform solder particles, it can only be achieved at a high cost penalty. A second problem in utilizing the solder paste screening technique in modern high density semiconductor devices is the available space between solder bumps. It is known that a large volume reduction occurs when a solder changes from a paste state to a cured stated, the screen holes for the solder paste must be significantly larger in diameter than the actual solder bumps to be formed. The large volume shrinkage ratio thus makes the solder paste screening technique difficult to carry out in high density devices.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique. Similarly, the thin film electrodeposition technique which also requires a ball limiting metallurgy layer to be deposited and defined by an etching process which has the same limitations as the C4 technique. For instance, a conventional thin film electrodeposition process for depositing solder bumps is shown in FIGS. 1A~1F.

A conventional semiconductor structure 10 is shown in FIG. 1A. The semiconductor structure 10 is built on a silicon substrate 12 with active devices built therein. A bond pad 14 is formed on a top surface 16 of the substrate 12 for making electrical connections to the outside circuits. The bond pad 14 is normally formed of a conductive metal such as aluminum. The bond pad 14 is passivated by a final passivation layer 20 with a window 22 opened by a photolithography process to allow electrical connection to be made to the bond pad 14. The passivation layer 20 may be formed of any one of various insulating materials such as oxide, nitride or organic materials. The passivation layer 20 is applied on top of the semiconductor device 10 to provide both planarization and physical protection of the circuits formed on the device 10.

Onto the top surface 24 of the passivation layer 20 and the exposed top surface 18 of the bond pad 14, is then deposited an under bump metallurgy layer 26. This is shown in FIG. 1B. The under bump metallurgy (UBM) layer 26 normally consists of an adhesion/diffusion barrier layer 30 and a wetting layer 28. The adhesion/diffusion barrier layer 30 may be formed of Ti, TiN or other metal such as Cr. The wetting layer 28 is normally formed of a Cu layer or a Ni layer. The UMB layer 26 improves bonding between a solder ball to be formed and the top surface 18 of the bond pad 14.

In the next step of the process, as shown in FIG. 1C, a photoresist layer 34 is deposited on top of the UMB layer 26 and then patterned to define a window opening 38 for the solder ball to be subsequently formed. In the following electrodeposition process, a solder ball 40 is electrodeposited into the window opening 38 forming a structure protruded from the top surface 42 of the photoresist layer 34. The use of the photoresist layer 34 must be carefully controlled such that its thickness is in the range between about 30 $\mu$m and about 40 $\mu$m, preferably at a thickness of about 35 $\mu$m. The reason for the tight control on the thickness of the photoresist layer 34 is that, for achieving a fine-pitched solder bump formation, a photoresist layer of a reasonably small thickness must be used such that a high imaging resolution can be achieved. It is known that, during a photolithography process, the thicker the photoresist layer, the poorer is the imaging process. To maintain a reasonable accuracy in the imaging process on the photoresist layer 34, a reasonably thin photoresist layer 34 must be used which results in a mushroom configuration of the solder bump 40 deposited therein. The mushroom configuration of the solder bump 40 contributes greatly to the inability of a conventional process in producing fine-pitched solder bumps.

Referring now to FIG. 1E, wherein the conventional semiconductor structure 10 is shown with the photoresist layer 34 removed in a wet stripping process. The mushroom-shaped solder bump 40 remains while the under bump metallurgy layer 26 is also intact. In the next step of the process, as shown in FIG. 1F, the UBM layer 26 is etched away by using the solder bump 40 as a mask in an wet etching process. The solder bump 40 is then heated in a reflow process to form solder ball 42. The reflow process is conducted at a temperature that is at least the reflow temperature of the solder material.

In recent years, chip scale packages (CSP) have been developed as a new low cost packaging technique for high volume production of IC chips. One of such chip scale packaging techniques has been developed by the Tessera Company for making a so-called micro-BGA package. The micro-BGA package can be utilized in an environment where several of the packages are arranged in close proximity on a circuit board or a substrate much like the arrangement of individual tiles. Major benefits achieved by a micro-BGA package are the combined advantages of a flip chip assembly and a surface mount package. The chip scale packages can be formed in a physical size comparable to that of an IC chip even though, unlike a conventional IC chip such as a flip chip, the chip scale package does not require a special bonding process for forming solder balls. Furthermore, a chip scale package may provide larger number of input/output terminals than that possible from a conventional quad flat package, even though a typical quad flat package is better protected mechanically from the environment.

To further reduce the fabrication cost of IC devices, it is desirable that if a whole wafer can be passivated to seal the IC dies on the wafer, and then be severed into individual IC dies from the wafer such that not only the benefits of a chip scale package can be realized, the packaging cost for the IC dies may further be reduced.

A large number of IC chips are designed with a peripheral array of I/O pads. For modern high density devices, the pitch allowed between I/O pads is steadily decreasing. An I/O pad redistribution process is frequently necessary for changing a peripheral array to an area array in order to improve pitch between the conductive pads. During the redistribution process, metal traces are frequently used to extend bond pads from a peripheral area to a center area on the chip. Due to the limited space available for the metal traces, especially those traces that run an extended distance, it is desirable to produce metal traces that are stress buffered in order to assure the reliability of a chip.

On a wafer level chip scale package, or a wafer level CSP, an insulating material layer that is frequently of polymeric base is used to encapsulate the entire wafer structure prior to the severing of individual chips from the wafer. The purpose of the encapsulation is to protect both mechanically and chemically the semiconductor devices fabricated on the wafer. To protect the devices mechanically means to shield the device from mechanical abrasion other damages during packaging of the device. To protect the devices chemically means to shield the device from moisture penetration and particulate contamination.

A typical wafer level CSP device 50 is shown in FIG. 2 in a partial, cross-sectional view. The device 50 is built on a silicon substrate 44 which has a plurality of bond pads 46 formed thereon. On top of the bond pads 46, is deposited an insulating material layer 48 such as an oxide layer. A metal conductive layer 52 is then deposited on top of the bond pads 46, the insulating material layer 48 and lithographically formed into input/output redistribution lines. On top of a distal end 54 of the I/O redistribution line is first coated with a thin layer of copper, and then formed a copper post 56, i.e. between 75~100 μm, by filling a via opening with copper typically by a plating technique. A solder ball 58 is planted on top of the copper post 56 to complete the wafer level CSP process.

In the conventional structure 50, shown in FIG. 2, the thickness of the silicon substrate 44 is about 500 μm, while the encapsulant layer 60 on top of the substrate 44 is about 100 μm. Since the coefficient of thermal expansions of the two materials are different, i.e. the polymeric-based encapsulant 60 has a higher coefficients of thermal expansion than the silicon substrate 44. The mismatch between the coefficient of thermal expansion therefore leads to a significant warpage over the entire surface area of a wafer. The warpage problem is particularly severe in a large wafer such as in a 200 mm or in a 300 mm wafer.

Others have attempted to minimize or eliminate the warpage problem of the wafer level chip scale package caused by the thermal expansion differences described above. One method is to reduce the thickness of the encapsulant layer 60. However, when the thickness of the encapsulant layer 60 is reduced, the stand-off of the solder ball 58 from the silicon substrate 44 is also reduced. A reduced stand-off for the solder ball 58 can lead to other electrical problems such as solder ball cracking due to thermal stress after the package is mounted on the PCB.

Another attempt to reduce the warpage problem in wafer level chip scale package is shown in FIG. 3. Instead of the copper post 56 utilized in FIG. 2, solder balls 64, 66 are utilized in structure 62. The encapsulant layer 68 is dispensed on each die surface individually to create a discrete encapsulated wafer level CSP 62. After planarization of the encapsulated wafer surface, the package solder ball 66 is attached to the first solder ball 64. Even though a thinner die thickness and a larger standoff height are achieved, the process throughput is greatly reduced due to the added processing steps since the encapsulant layer must be dispensed on each die surface individually, and furthermore, the quality of encapsulation is difficult to control.

It is therefore an object of the present invention to provide a method for fabricating wafer level chip scale package with an encapsulant layer on top without the drawbacks or shortcomings of the conventional method.

It is another object of the present invention to provide a method for fabricating wafer level CSP with discrete package encapsulation.

It is a further object of the present invention to provide a method for fabricating wafer level CSP by forming islands of encapsulant with one island on top of each semiconductor die.

It is another further object of the present invention to provide a method for fabricating wafer level CSP with discrete package encapsulation formed by two different types of photoresist coatings on top of the wafer.

It is still another object of the present invention to provide a wafer level CSP that has a thick layer of encapsulant coated on top to minimize the coefficient of thermal expansion mismatch problem.

It is yet another object of the present invention to provide a wafer level CSP that has a plurality of trench openings formed on top of the wafer surface in-between a plurality of IC dies severing an encapsulant layer.

It is still another further object of the present invention to provide a method for fabricating wafer level CSP without coefficient of thermal expansion mismatch problem by first coating a dry film photoresist layer on top of the wafer followed by filling a plurality of trench openings over the scribe lines with a liquid photoresist material.

SUMMARY OF THE INVENTION

In accordance with the present invention, a method for fabricating wafer level chip scale package that has discrete package encapsulation and devices formed by the method are disclosed.

In a preferred embodiment, a method for fabricating a wafer level CSP with discrete package encapsulation can be carried out by the operating steps of providing a pre-processed wafer that has a first plurality of bond pads formed on top and a passivation layer formed in-between the pads; depositing a first conductive metal layer for I/O redistribution on top of the passivation layer and the first plurality of bond pads; depositing a first photoresist (PR) material forming a first PR layer on top of the first conductive metal layer; patterning the first PR layer to form a second plurality of trench openings each adapted to separate at least two IC chips and a third plurality of via openings each exposing the first conductive metal layer; depositing a second photoresist material and filling the second plurality of trench openings; filling the third plurality of via openings with a second conductive metal forming a third plurality of vias; removing the first PR material without disturbing the second PR material; lithographically forming I/O redistribution lines from the first conductive metal layer; forming an encapsulant layer on top of the I/O redistribution lines and embedding the second PR material and the third plurality of vias; planarizing the encapsulant layer, exposing top surfaces of the second PR material and the third plurality of vias; removing the second PR material forming a second plurality of trench openings dividing the IC chips into discrete packages; removing the first conductive metal layer in the second plurality of trench openings; and attaching a third plurality of solder balls on top of the third plurality of vias.

The method for fabricating a wafer level CSP with discrete package encapsulation may further include the step of depositing a dry film photoresist forming the first PR layer, or the step of depositing the second photoresist material in a liquid photoresist material. The method may further include the step of depositing the second photoresist material by a printing technique. The method may further include the step of filling the third plurality of via openings with at least one conductive metal selected from the group consisting of Au, Ag, Al, Cu and Ni. The method may further include the step of forming the encapsulant layer by a screen printing or stencil printing technique. The method may further include the step of filling the third plurality of via openings by an electroplating or an electroless plating technique. The method may further include the step of removing the second PR material by a wet stripping technique or by a dry stripping technique, or the step of removing the first conductive metal layer by wet etching, or the step of removing the first PR material by an etchant that has an etch rate toward the first PR material that is at least 5 times the etch rate toward the second PR material.

The present invention is further directed to a wafer level chip scale package which includes a wafer that has a first plurality of IC chips formed on a top surface; an insulating material layer overlying the plurality of IC chips; and a second plurality of trench openings formed in-between the first plurality of IC chips severing the insulating material layer.

The wafer level CSP may further include a third plurality of solder balls planted on each of the first plurality of IC chips. The insulating material layer may be an encapsulant layer. Each of the first plurality of IC chips forms a discrete island with an encapsulant layer on top. The second plurality of trench openings is formed along scribe lines between the first plurality of IC chips.

The present invention is still further directed to a method for fabricating wafer level chip scale package without coefficient of thermal expansion mismatch problem which can be carried out by the steps of providing a pre-processed wafer that has a first plurality of bond pads formed on top and a passivation layer formed in-between the pads; depositing a first conductive metal layer for I/O redistribution on top of the passivation layer and the first plurality of bond pads; depositing a dry film photoresist (PR) layer on top of the first conductive metal layer; patterning the dry film PR layer forming a second plurality of trench openings each adapted to separate at least two IC chips and a third plurality of via openings each exposing the first conductive metal layer; filling the second plurality of trench openings with a liquid photoresist material; filling the third plurality of via openings with a second conductive metal forming a third plurality of vias; stripping the dry film PR material without removing the liquid PR material; lithographically forming I/O redistribution lines from the first conductive metal layer; printing an encapsulant layer on top of the I/O redistribution lines embedding the liquid PR material and the third plurality of vias; removing the liquid PR material forming a second plurality of trench openings dividing the wafer into discrete packages; and planting a third plurality of solder balls on top of the third plurality of vias.

The method for fabricating wafer level CSP without coefficient of thermal expansion mismatch problem may further include the step of forming the third plurality of vias with at least one metal selected from the group consisting of Au, Ag, Al, Cu and Ni. The method may further include the step of filling the third plurality of via openings by an electroplating or an electroless plating technique. The method may further include the step of stripping the dry film photoresist by an etchant that has an etch selectivity larger than 5 toward the liquid photoresist material, or the step of filling the second plurality of trench openings by a screen printing or a stencil printing technique.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for fabricating a wafer level chip scale package with discrete package encapsulation and devices formed by the method.

In the preferred embodiment, the method is carried out by first providing a pre-processed wafer that has a plurality of bond pads formed on top and then depositing a first conductive metal layer on top of the bond pads. A dry film photoresist layer is then laminated to the top of the first conductive metal layer, followed by a patterning process to form a plurality of trench openings separating IC dies on the wafer and a plurality of via openings to expose the conductive metal layer. A liquid photoresist material is then used to fill the plurality of trench openings, while a second conductive metal is used to fill the plurality of via openings to form via plugs. The dry film photoresist layer is then removed and I/O redistribution lines are formed lithographically from the conductive metal layer. An encapsulant layer is then deposited on top of the I/O redistribution lines to embed the liquid photoresist material and the plurality of via plugs. After the t op surface of the encapsulant layer is planarized, the liquid photoresist material is removed to expose a plurality of trench openings that divides the wafer into discrete packages. A plurality of solder balls is then planted on top of the plurality of via plugs to form a flip chip structure.

The present invention therefore utilizes a dry film photoresist layer t o pre-define the stand-off on the scribe lines to separate the individual dies formed on the wafer. The encapsulant layer can be readily applied by a printing technique of either screen printing or stencil printing. The photoresist layer formed by a liquid photoresist material is etched away to form trenches in-between and to separate the encapsulant layer into individual, discrete packages such that the warpage problem caused by coefficient of thermal expansion mismatch across the wafer surface can be minimized. The present invention novel method therefore is effective in increasing the throughput and quality of the IC dies produced. By utilizing the present invention novel method, not only a thin die thickness and a large stand-off height can be achieved to enhance package solder ball joint reliability, but also there is no compromise on the process throughput and the quality of the encapsulation.

In the preferred embodiment illustrated below in FIGS. 4A–4J, a printing technique for applying the encapsulant layer and a gold-nickel post for forming the via plugs are illustrated. However, any other method for applying the encapsulant layer and any other via plug material may be similarly used to achieve the same desirable beneficial result of the present invention. By utilizing the method, discrete non-continuous structure of individual IC dies are formed on top of a wafer surface such that warping of the individual dies can be reduced.

Figure 1A:
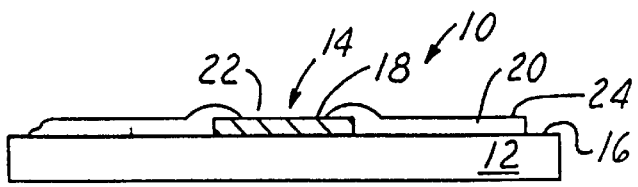
FIGS. 1A~1F are enlarged, cross-sectional views illustrating a conventional process for forming solder bumps on a flip chip.
Figure 1B:
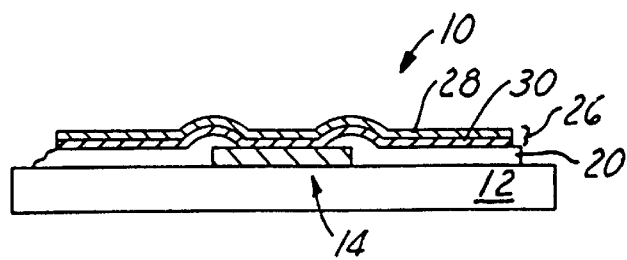
Figure 1C:
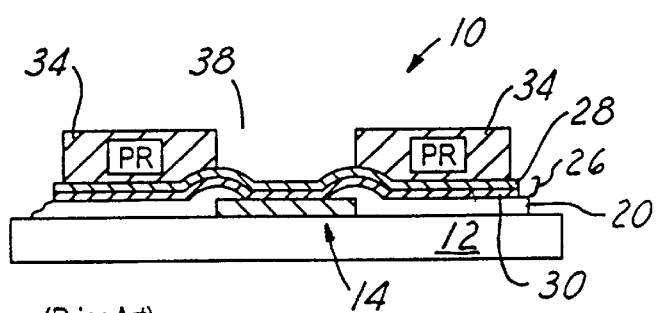
Figure 1D:
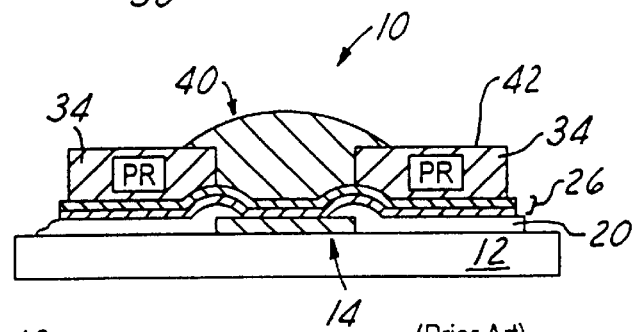
Figure 1E:
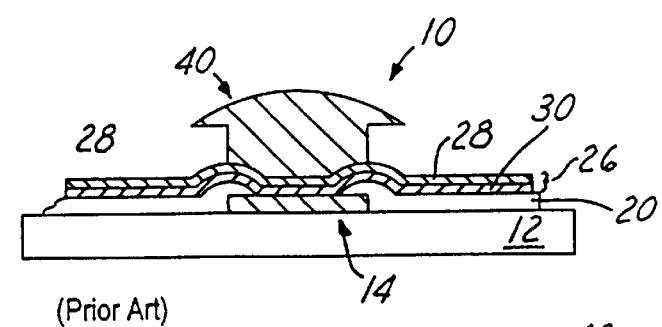
Figure 1F:
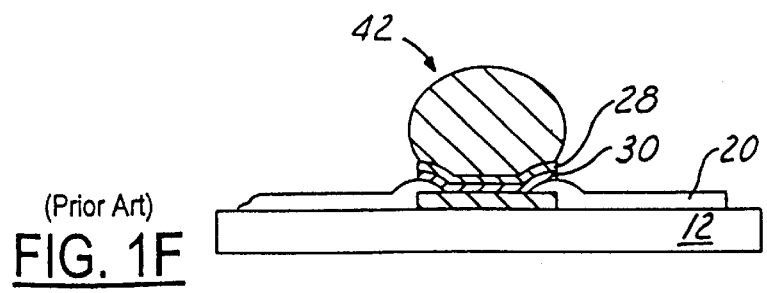
Figure 2:
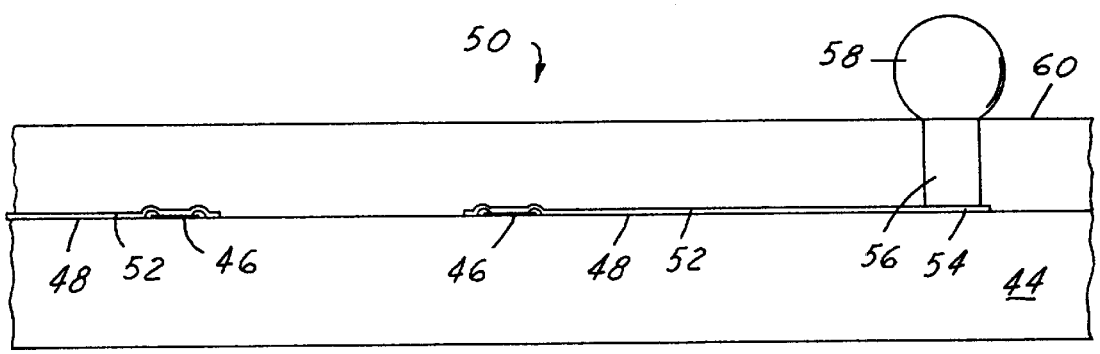
FIG. 2 is an enlarged, cross-sectional view of a conventional structure illustrating a solder ball formed on a copper post which is embedded in an encapsulant layer.
Figure 3:
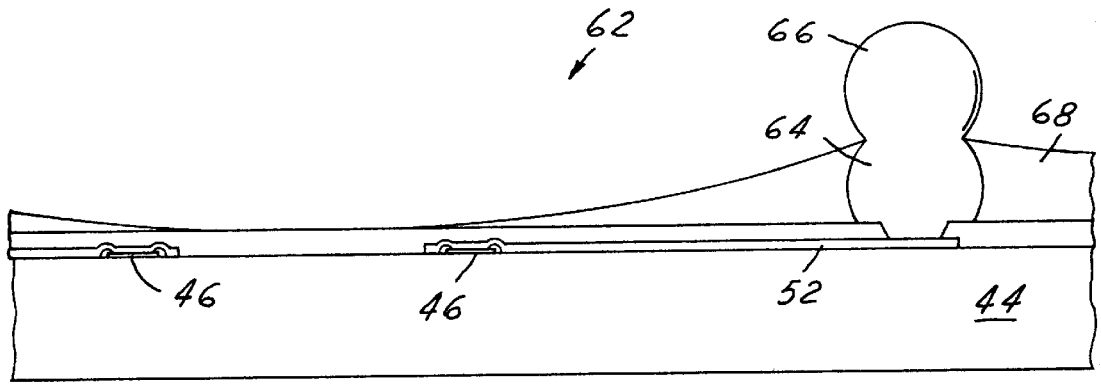
FIG. 3 is an enlarged, cross-sectional view of another conventional structure of solder balls built on an encapsulant layer wherein a solder ball replaces the copper post.
Figure 4A:
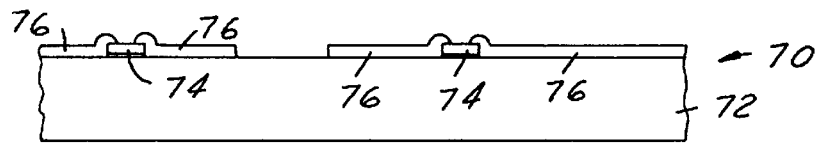
FIGS. 4A~4J are enlarged, cross-sectional views illustrating the present invention method for forming solder balls on an encapsulant layer incorporating a discrete package encapsulation technique.
Figure 4B:
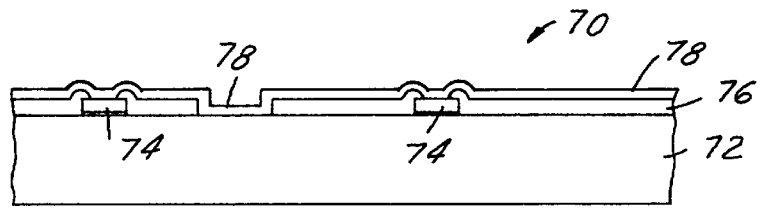

Referring now to FIG. 4A, wherein an enlarged, cross-sectional view of a present invention semiconductor structure 70 is shown. The semiconductor structure 70 is built on a silicon substrate 72 by first forming a plurality of bond pads 74 each protected by an insulating material layer 76. The semiconductor structure 70 is then coated, typically by a sputtering method, a first conductive metal layer 78 such as aluminum on top of the bond pads 74 and the insulating material layer 76. This is shown in FIG. 4B. The first conductive metal layer 78 will be used to form I/O redistribution lines in a future processing step.

Figure 4C:
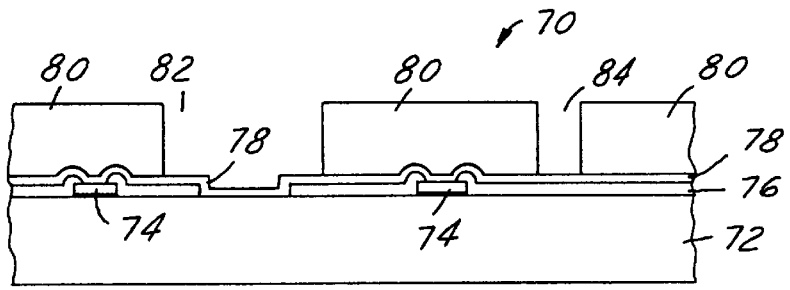
Figure 4D:
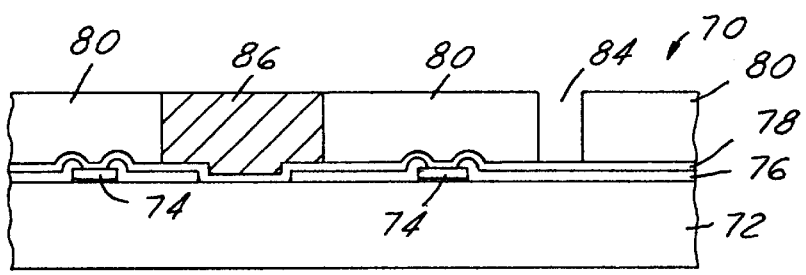

FIG. 4C illustrates the next process step wherein a dry film photoresist layer 80 is deposited on top of the semiconductor 70 and then patterned to form a plurality of trench openings 82 and a plurality of via openings 84. The dry film photoresist layer 80 is frequently formed of a polymeric material which has a significantly larger coefficient of thermal expansion than that of the silicon substrate 72. A liquid photoresist material 86 is then used to fill the plurality of trench openings 82, as shown in FIG. 4D. The liquid photoresist material 86 can be advantageously applied to the top surface of the semiconductor structure 70 by a printing technique, such as screen printing or stencil printing. The liquid photoresist material 86 can be etched away by an etchant that has a different chemistry than that used to etch away the dry film photoresist layer 80. This is an important requirement for the present invention novel method such that the dry film photoresist layer 80 can first be removed for the printing of an encapsulant layer.

Figure 4E:
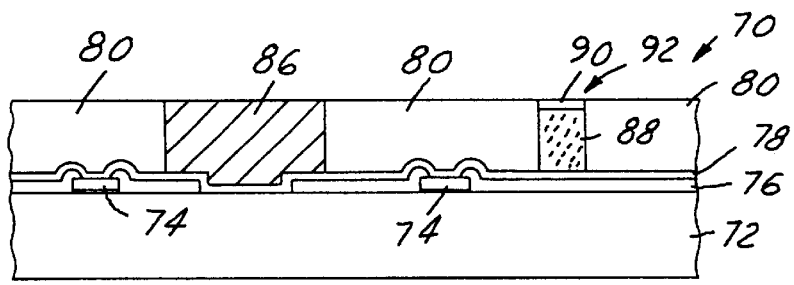
Figure 4F:
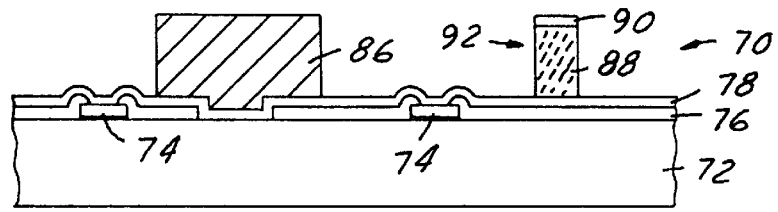

In the next step of the process, as shown in FIG. 4E, the plurality of via openings 84 is filled with a second conductive metal 88, such as gold and a third conductive metal 90 such as nickel. The Au/Ni combination is suitable for the preferred embodiment of the present invention, however, it does not necessarily limit the materials that can be used for forming the via plugs 92. The filling of the plurality of via openings 84 can be advantageously conducted by a plating technique such as electroplating or electroless plating. The plating technique allows the filling of high aspect ratio holes in a short time period. The dry film photoresist layer 80 is then removed by a stripping method, such as dry stripping or wet stripping, with a suitable etchant designed for the dry film photoresist layer 80. This is shown in FIG. 4F.

Figure 4G:
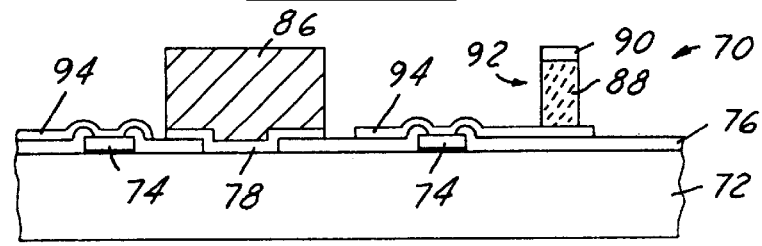
Figure 4H:
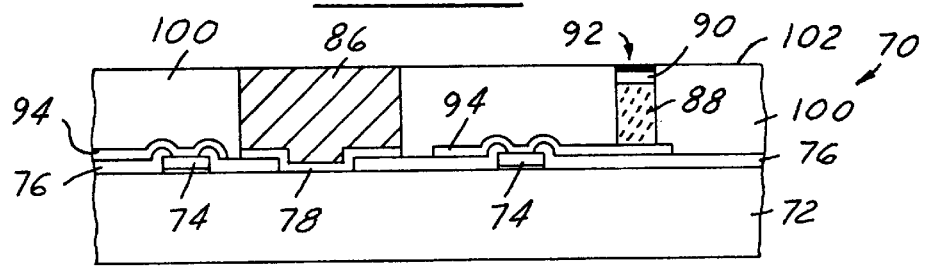
Figure 4I:
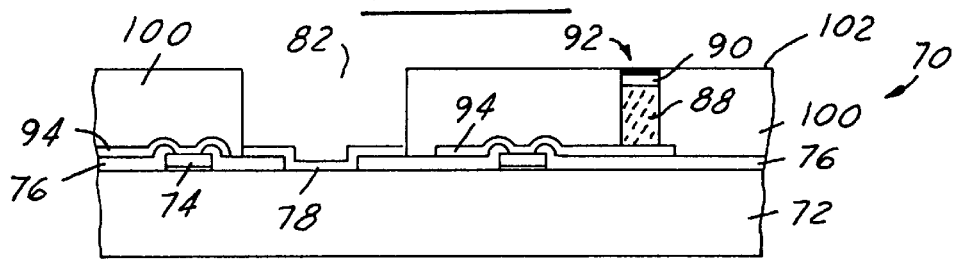

In the next step of the process, as shown in FIG. 4G, I/O redistribution lines 94 are formed by a photolithographic process to establish electrical communication between each of the bond pads 74 and one of the via plugs 92. An encapsulant layer 100 is then printed on top of the semiconductor structure 70 to embed the plurality of protrusions 86 formed by the liquid photoresist material and the plurality of via plugs 92. The printing technique used to apply the encapsulant layer 100 allows an improved throughput for the process due to the faster speed of printing. Either a screen printing or a stencil printing technique may be used for applying the encapsulant layer 100. The process is then continued, as shown in FIG. 4I, with a step for removing the protrusion 86 formed of the liquid photoresist material by an etch-back process after the top surface 102 is first planarized. The etch-back process can be carried out by either a wet etch or a dry etch technique.

Figure 4J:
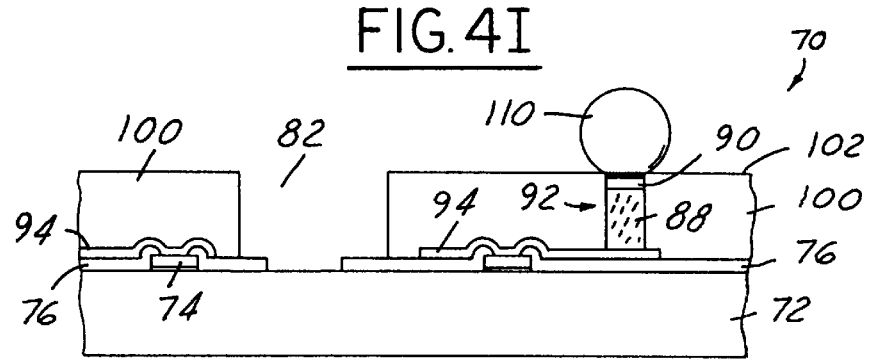

In the final step of the process, as shown in FIG. 4J, a plurality of solder balls 110 is planted with each on one of the via plugs 92 formed previously. A present invention flip chip structure on the wafer level chip scale package is thus formed wherein each flip chip structure 70 is separated from its neighboring structures by trench openings 82 such that the encapsulant layer 100 is non-continuous to avoid the excessive warpage problem caused by a mismatch of the coefficients of thermal expansion. The severing of the encapsulant layer 100 into discrete package encapsulation enables the formation of individual islands of the encapsulant material on top of each individual IC die. Prior to the solder ball 102 attach process, the first metal layer 78 may be advantageously removed by wet etch.

The present invention for fabricating a wafer level chip scale package with discrete package encapsulation and devices formed by the method have therefore been amply described in the above description and in the appended drawings of FIGS. 4A–4J.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for fabricating wafer level chip scale package (CSP) with discrete package encapsulation comprising the steps of:

providing a pre-processed wafer having a first plurality of bond pads formed on top and a passivation layer formed in-between the pads;

depositing a first conductive metal layer for I/O redistribution on top of said passivation layer and said first plurality of bond pads;

depositing a first photoresist (PR) material forming a first PR layer on top of said first conductive metal layer;

patterning said first PR layer to form a second plurality of trench openings each adapted to separate two IC chips and a third plurality of via openings each exposing said first conductive metal layer;

depositing a second photoresist material and filling said second plurality of trench openings;

filling said third plurality of via openings with a second conductive metal forming a third plurality of vias;

removing said first PR material without disturbing said second PR material;

lithographically forming I/O redistribution lines from said first conductive metal layer;

forming an encapsulant layer on top of said I/O redistribution lines and embedding said second PR material and said third plurality of vias;

planarizing said encapsulant layer exposing top surfaces of said second PR material and said third plurality of vias;

removing said second PR material forming a second plurality of trench openings dividing said IC chips into discrete packages;

removing said first conductive metal layer in said second plurality of trench openings; and attaching a third plurality of solder balls on top of said third plurality of vias.

2. A method for fabricating wafer level CSP with discrete package encapsulation according to claim 1 further comprising the step of depositing a dry film photoresist forming said first PR layer.

3. A method for fabricating wafer level CSP with discrete package encapsulation according to claim 1 further comprising the step of depositing said second photoresist material in a liquid photoresist material.

4. A method for fabricating wafer level CSP with discrete package encapsulation according to claim 1 further comprising the step of depositing said second photoresist material by a printing technique.

5. A method for fabricating wafer level CSP with discrete package encapsulation according to claim 1 further comprising the step of filling said third plurality of via openings with at least one conductive metal selected from the group consisting of Au, Ag, Al, Cu and Ni.

6. A method for fabricating wafer level CSP with discrete package encapsulation according to claim 1 further comprising the step of forming said encapsulant layer by a screen printing or stencil printing technique.

7. A method for fabricating wafer level CSP with discrete package encapsulation according to claim 1 further comprising the step of filling said third plurality of via openings by an electroplating or an electroless plating technique.

8. A method for fabricating wafer level CSP with discrete package encapsulation according to claim 1 further comprising the step of removing said second PR material by a wet stripping technique or by a dry stripping technique.

9. A method for fabricating wafer level CSP with discrete package encapsulation according to claim 1 further comprising the step of removing said first conductive metal layer by wet etching.

10. A method for fabricating wafer level CSP with discrete package encapsulation according to claim 1 further comprising the step of removing said first PR material by an etchant that has an etch rate toward said first PR material that is at least 5 times the etch rate toward said second PR material.

11. A method for fabricating wafer level chip scale package (CSP) without coefficient of thermal expansion mismatch problem comprising the steps of:

providing a pre-processed wafer having a first plurality of bond pads formed on top and a passivation layer formed in-between the pads;

depositing a first conductive metal layer for I/O redistribution on top of said passivation layer and said first plurality of bond pads;

depositing a dry film photoresist (PR) layer on top of said first conductive metal layer;

patterning said dry film PR layer forming a second plurality of trench openings each adapted to separate two IC chips and a third plurality of via openings each exposing said first conductive metal layer;

filling said second plurality of trench openings with a liquid photoresist material;

filling said third plurality of via openings with a second conductive metal forming a third plurality of vias;

stripping said dry film PR material without removing said liquid PR material;

lithographically forming I/O redistribution lines from said first conductive metal layer;

printing an encapsulant layer on top of said I/O redistribution lines embedding said liquid PR material and said third plurality of vias;

removing said liquid PR material forming a second plurality of trench openings dividing said wafer into discrete packages; and planting a third plurality of solder balls on top of said third plurality of vias.

12. A method for fabricating wafer level CSP without coefficient of thermal expansion mismatch problem according to claim 11 further comprising the step of forming said third plurality of vias with at least one metal selected from the group consisting of Au, Ag, Al, Cu and Ni.

13. A method for fabricating wafer level CSP without coefficient of thermal expansion mismatch problem according to claim 11 further comprising the step of filling said third plurality of via openings by an electroplating or an electroless plating technique.

14. A method for fabricating wafer level CSP without coefficient of thermal expansion mismatch problem according to claim 11 further comprising the step of stripping said dry film photoresist material by an etchant that has an etch selectivity larger than 5 toward said liquid photoresist material.

15. A method for fabricating wafer level CSP without coefficient of thermal expansion mismatch problem according to claim 11 further comprising the step of filling said second plurality of trench openings by a screen printing or stencil printing technique.

* * * * *